United States Patent [19]

Bestland

[11] 3,850,707

[45] Nov. 26, 1974

[54] SEMICONDUCTORS

[75] Inventor: Roy J. Bestland, Palm Beach Gardens, Fla.

[73] Assignee: Honeywell Inc., Minneapolis, Minn.

[22] Filed: Mar. 23, 1967

[21] Appl. No.: 643,759

Related U.S. Application Data

[62] Division of Ser. No. 395,237, Sept. 9, 1964, abandoned.

[52] U.S. Cl. ...................... 148/175, 29/577, 29/578, 29/580, 117/106 A, 117/201, 117/212, 148/174, 317/101 A, 357/49, 357/44

[51] Int. Cl. ...... H01l 7/36, B01j 17/00, H01l 27/12

[58] Field of Search ............ 148/174, 175; 117/106, 117/201, 212; 29/577, 580, 578; 317/101, 234, 235

[56] References Cited

UNITED STATES PATENTS

| | | | |
|---|---|---|---|
| 3,192,083 | 6/1965 | Sirtl | 148/175 |
| 3,265,542 | 8/1966 | Hirshon | 148/175 |
| 3,290,753 | 12/1966 | Chang | 29/577 |
| 3,296,040 | 1/1967 | Wigton | 148/175 |
| 3,320,485 | 5/1967 | Buie | 317/101 |
| 3,393,349 | 7/1968 | Huffman | 317/101 |
| 3,461,003 | 8/1969 | Jackson, Jr. | 317/234 |

*Primary Examiner*—L. Dewayne Rutledge
*Assistant Examiner*—W. G. Saba
*Attorney, Agent, or Firm*—Omund R. Dahle; David R. Fairbairn

[57] ABSTRACT

A method of forming dielectrically isolated islands of single crystal semiconductor material in a master blank suitable for use in the manufacture of integrated circuits. Epitaxial growth of regions of single crystal semiconductor through holes in oxide covering a single crystal substrate is used. A dielectric coating is formed over the epitaxial deposit which is then backed with polycrystalline material. The original wafer is removed to expose the single crystal epitaxial material.

5 Claims, 11 Drawing Figures

INVENTOR.
ROY J. BESTLAND
BY
ATTORNEY

INVENTOR.
ROY J. BESTLAND
BY Robert J. Vidas
ATTORNEY

SEMICONDUCTORS

This application is a division of my copending application Ser. No. 395,237, filed Sept. 9, 1964, entitled "Semiconductors", now abandoned.

The present invention is directed to semiconductors and is more particularly directed to an improved technique for use in the production of microelectronic circuits in single bodies of semiconductor material.

Semiconductor devices have found widespread acceptance in the electronic art. In more recent years strong emphasis has been placed in the semiconductor industry upon the production of entire circuits within a single body of semiconductor material. For example, transistors, diodes, resistors, and other electrical components have been produced within a single body and then interconnected so as to form a desired circuit or some significant portion thereof. Through this type of technique it has been possible to miniaturize devices to a point where entire circuits are reproduced in areas considerably smaller than was formerly possible to produce individual circuit components.

One persistent problem has existed in the manufacture of such miniaturized devices. That problem is the production of the individual circuit components within the single block of semiconductor material in a manner such as to reduce both the electrical leakage between the component parts and also to reduce parasitic capacitance. A common prior art technique has been to interject a P-N junction between the active individual circuit elements to provide a barrier therebetween. This type of approach while possible does not provide complete electrical isolation, nor does it provide an essentially capacitance free isolation technique. By the use of the present technique there is provided a master chip of semiconductor material wherein individual islands or pads of epitaxially grown single crystal semiconductor material are insulated from one another in the body by a combination of an oxide and polycrystalline semiconductor material.

Accordingly, it is an object of the present invention to provide a master chip for the production of microelectronic circuits wherein the individual active element regions of the chip are electrically isolated from one another;

It is a further object of the present invention to provide such a chip wherein the active element portions are entirely of epitaxially grown single crystal semiconductor material;

Other and further objects will be apparent from a study of the specification and drawings wherein the production of master chips in accordance with the present invention are schematically illustrated.

FIGS. 1*a* to 1*e* represents in schematic form the production of a master chip in accordance with the present invention.

FIGS. 2*a* to 2*f* is a representation of a modification of the device and procedure shown in FIG. 1.

Figure 1A:
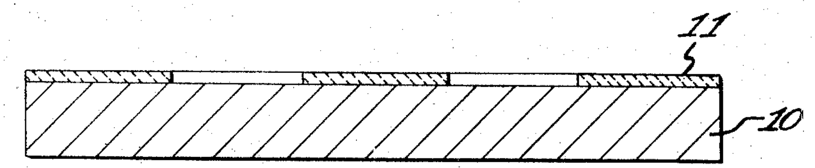

Referring now to FIG. 1 there is seen in FIG. 1*a* a body of single crystal silicon approximately 5 mils in thickness. The present invention will be described with regard to the silicon although the principals of the invention are equally extensible to other semiconductor materials such as germanium and also to mixed semiconductor materials of the group III and group V type. On the surface of the semiconductor material 10 there is located a layer of silicon dioxide 11 that has been produced by techniques well known to those skilled in the art. Such a film can be readily grown thermally from the underlying silicon through treatment of the body in a moist hydrogen atmosphere at elevated temperatures or it may be produced by deposition techniques. Portions of the oxide have been removed by the use of photolithographic techniques to leave exposed regions of the surface of the single crystal silicon body 10. The oxide layer 11 should be in excess of 1,000 A thickness and is preferably about 5,000 A in thickness.

Figure 1B:
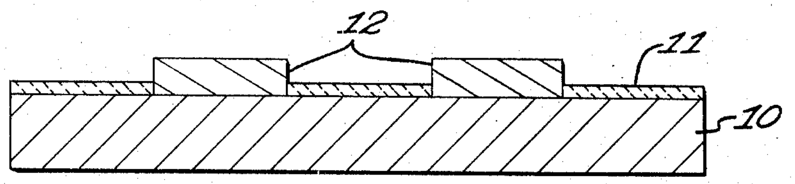
Figure 1C:
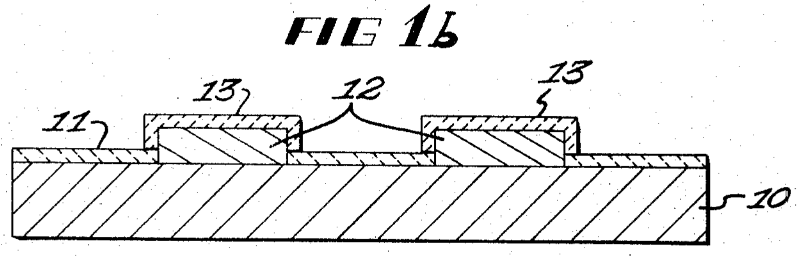
Figure 1D:
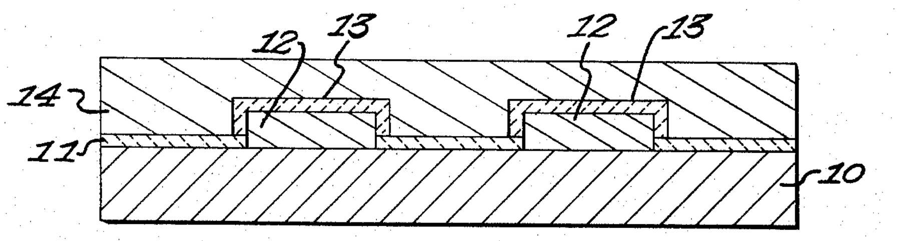
Figure 1E:
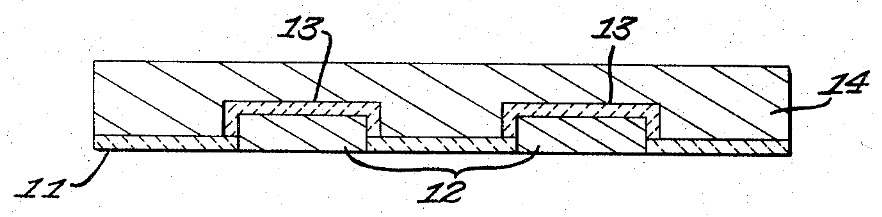

In FIG. 1b there is shown a growth of single crystal epitaxial silicon 12 into the regions where the holes have been cut through the oxide 11. It is known that single crystal material will not grow on the surface of silicon dioxide but will grow on the surface of a single crystal material. By control of the rate of growth none or only extremely small quantities of polycrystalline silicon deposit on the surface of the oxide during the epitaxial growth of quantities of the single crystal epitaxial material 12. The conditions for achieving such single crystal growth are known. I have found that a suitable condition for the growth of single crystal material involves heating of the substrate to a temperature of about 1,220° C. and passing a mixture of silicon tetrachloride and hydrogen over the substrate. In order to obtain the highest quality of epitaxial silicon it is necessary that the substrate exposed through the oxide layer 11 be highly polished. A suitable technique for producing this high quality substrate is to chemically polish the substrate in anhydrous hydrogen chloride. Such a procedure is described in the RCA Review, Vol. 24, No. 4, for December 1963, beginning at page 488. The maximum rate of growth of the single crystal epitaxial material is about 0.6 mils per hour. When faster rates are utilized these coincide with the growth of polycrystalline material on the oxide layer 11. In order to inhibit the growth of the polycrystalline material on the surface of oxide layer 11 somewhat slower growth rates are desirable.

Following deposition of approximately 1 mil in thickness of epitaxial material 12 an oxide layer 13 is produced over the surface of the newly deposited epitaxial material 12. This oxide layer may be produced in a number of different ways although I have found that the use of a continuous process for all stages of the production of the device of the invention is preferred to avoid contamination and handling difficulties. Therefore, an oxide deposition technique is desirable. It is also desirable to keep the temperature of the deposition furnace at some constant point to simplify manufacturing procedures. Therefore in all stages of the production of the device the furnace was kept at a temperature of approximately 1,220° C. The oxide layer 13 is thus produced in the furnace utilizing a mixture of a hydrogen carrier gas in combination with silicon tetrachloride and approximately 6 percent by volume of carbon dioxide. The optimum rate for deposit of the oxide layer 13 is about 1,000 A per minute. The oxide layer 13 should be at least 1,000 A in thickness and preferably be about 6,000 A in thickness to insure that the next stage produces a polycrystalline semiconductor material that is in complete electrical isolation from the epitaxially grown material 12.

Following the production of the oxide layer 13 a polycrystalline silicon layer 14 is produced over the entire exposed surface of the assembly. As there is no longer any single crystal semiconductor material available to act as a catalytic surface nor as a substrate for the growth of single crystal material the material now deposited takes on the characteristics of the oxide which is such as to produce polycrystalline material. The growth rate also influences the characteristics of the material deposited so that a higher rate of growth is an aid to producing essentially polycrystalline deposits. I have found that a growth rate of about 5 mils in about 100 minutes is satisfactory.

Following the production of a polycrystalline material 14 of a thickness in the area of 5 mils the polycrystalline material is lapped into parallel relation with the original wafer 10. The original wafer 10 is then ground off down to the original oxide layer 11 to leave exposed the epitaxial material 12 now completely encapsulated within an oxide film with the exception of the upper exposed surface. Thus the individual islands or pads of semiconductor material are available for formation of the individual components and are yet totally insulated from one another by the oxide layer 13 and by polycrystalline material of high resistivity. The known manner of diffusion through oxide masks can then be utilized in the production of the various types of semiconductor circuit components.

In the generalized example described above no specific conductivity type of semiconductor material was specified. However, it should be readily apparent that one may produce any type conductivity desired by the inclusion or exclusion of the impurity causing the specific conductivity type. The impurity may be introduced into the reaction mixture either by inclusion in the silicon tetrachloride source itself or may be introduced through an auxillary system.

Figures 2A, 2B, 2C, 2D, 2E, 2F:
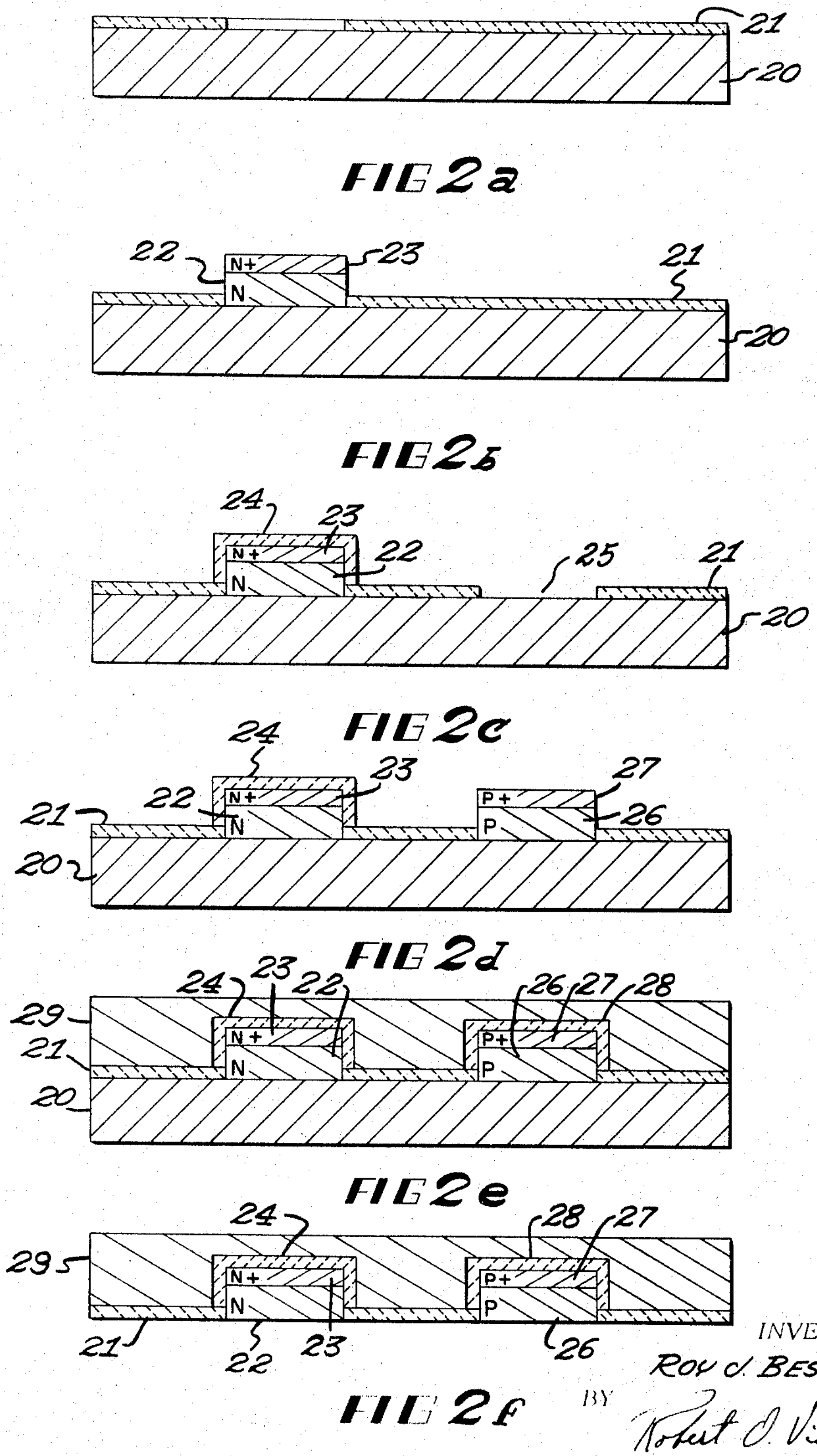

As a further example of the present invention the reader's attention is directed to FIG. 2 wherein there is shown in schematic form a modification of the procedure shown in FIG. 1. In FIG. 2*a* there is illustrated a wafer of single crystal semiconductor material 20 upon which there has been produced an oxide layer 21 which has been selectively removed from a limited layer of the single crystal material to provide an exposed surface of single crystal silicon.

In FIG. 2*b* a single crystal N type silicon 22 has been selectively grown onto the surface of wafer 20 in much the same manner as described with regard to FIG. 1. The only difference is that a quantity of phosphorous has been added to the reaction gas to produce the desired level of impurity atom. Following deposition of the desired thickness of N type silicon 22 the impurity level of phosphorous in the reaction gas is increased so that an ultimate layer of N+ material 23 is produced.

The epitaxially deposited material is then coated with a layer of silicon dioxide 24 in the same manner as was described in the similar step with regard to FIG. 1. A hole 25 is cut through the oxide layer 21 at a second position so as to expose the single crystal material 20. The hole is produced through photolithographic and selected etching techniques in the known way.

In FIG. 2*d* a layer of P type epitaxially grown single crystal material 26 has been produced onto the surface of layer 20 through the opening 25. Again as in production of the N type material the P type material will only deposit upon the single crystal material. No deposit occurs upon the oxided surfaces of the balance of the crystal. The P type material may be readily produced through inclusion of a quantity of boron in the gaseous atmosphere which reacts to produce the single crystal deposit. As a final stage in the production of the P type epitaxial material 26 the doping level of boron is increased to produce a P+ layer 27. Oxide is again deposited over the surface of the assembly.

The drawings of both the N+ and P+ deposition show the heavily doped layer only on the top of the lightly doped layer. In actuality, there would be a heavily doped layer over all the exposed surfaces of the less heavily doped region.

In FIG. 2*e* there is illustrated the oxide layer now covering both the N type material and the P type material and further showing growth of a polycrystalline material 29 over the entire surface. As described with regards to FIG. 1*d* the polycrystalline material can be produced in the same manner as a single crystal material is produced with the exception that there is no single crystal substrate present and that the growth rate is somewhat higher than in the instance of the production of the single crystal epitaxial material.

In FIG. 2*f* single crystal material 20 has been lapped off down to oxide layer 21 so as to expose the epitaxially grown single crystal material of N type 22 and of P type 26. Buried at the base of each of these regions is a N+ or P+ material respectively. The function of this high conductivity region is now believed apparent. When devices are ultimately produced from the individual pads or islands of single crystal material it is desirable to have good conductivity across the back side of these crystals so as to gain maximum efficiency. For example if one is to make a transistor of the N type material one would diffuse through a portion of the upper surface thereof boron to produce a P type region and then a material such as phosphorus into a portion of the P type region to produce a second N type material. In making lead connections to the collector region it is desirable to have a buried N+ region to gain good conductivity for most efficient transistor action. Likewise one may produce a PNP transistor in region 26 by diffusion of an N type impurity followed by diffusion of a P type impurity within the N type regions so as to produce the PNP structure.

There has been illustrated a means of producing transistors of both NPN and PNP type within a single body of semiconductor substrate. The present invention is also applicable to the production of diodes and resistors as well as transistors. Likewise, capacitors may also be formed through the use of appropriate diffusion and lead attachments. Various other modifications can be made in the way of producing suitable isolated pads of semiconductor material for production of overall integrated circuits. The interconnection of leads between the active elements would be in a usual manner of evaporating a metal such as aluminum over the intervening oxide between the isolated pads and then etching by photolithographic techniques to produce the desired leading.

I claim:

1. A process of producing a master chip of semiconductive material for production of integrated circuit semiconductor devices having dielectrically isolated single crystal regions of P and N type conductivity comprising:

A. Forming a silicon oxide layer on at least one surface of a body of single crystal silicon material, B. Exposing at least one limited region of said silicon material by removing portions of the oxide coating, C. Epitaxially depositing silicon of a first conductivity type on the exposed portion of said silicon material to predetermined thickness, D. Producing a silicon oxide layer over the epitaxially deposited first conductivity type material, E. Exposing at least one second limited region of said silicon material by removing portions of the oxide coating, F. Epitaxially depositing silicon of a second conductivity type on the exposed portions of said silicon material to a predetermined thickness, G. Producing a silicon oxide layer over the epitaxially deposited second conductivity type material, H. Depositing a poly crystalline silicon material over the assembly to a predetermined thickness, I. Removing all of the original single crystal silicon material to thereby produce a body containing islands of single crystal silicon material of opposite conductivity type dielectrically isolated from one another.

2. The method in accordance with claim 1 wherein the epitaxially deposited material is sequentially deposited to produce low and high impurity concentration regions of the same conductivity type in each of the first and second openings respectively.

3. A method of forming an integrated circuit structure comprisng the steps of: (a) providing a semiconductor crystal body; (b) depositing a first oxide layer over a surface of said body; (c) selectively removing a portion of said first oxide layer to form an opening therein and expose a first portion of said surface of said body through said opening; (d) growing a first epitaxial layer of a first conductivity type on said first portion of said surface of said body exposed through said opening in said oxide layer; (e) depositing a second oxide layer over said first epitaxial layer and over said first oxide layer; (f) selectively removing a portion of said first and second oxide layers to form a further opening therein and expose a second portion of said surface of said body through said further opening; (g) growing a second epitaxial layer of a second conductivity type on said second portion of said surface of said body exposed through said further opening; (h) depositing a further oxide layer over said second epitaxial layer and over said second oxide layer; (i) forming a crystalline deposit over said further oxide layer; and (j) removing said body to expose a surface of said first epitaxial layer and to expose a surface of said secnd epitaxial layer.

4. The method defined in claim 3 in which said semiconductor crystal body is formed of silicon, and in which said oxide layers are formed of silicon dioxide.

5. The method defined in claim 3 in which said portions of said oxide layers are selectively removed by photoetching.

* * * * *